(12) United States Patent
Zeng et al.

(10) Patent No.: US 12,389,574 B2
(45) Date of Patent: Aug. 12, 2025

(54) INVERTER HAVING HEAT CONDUCTING COMPONENT

(71) Applicant: Sungrow (Shanghai) Co., Ltd., Shanghai (CN)

(72) Inventors: Bing Zeng, Shanghai (CN); Haiyang Yu, Shanghai (CN); Ru Wang, Shanghai (CN)

(73) Assignee: Sungrow (Shanghai) Co., Ltd., Shanghai (CN)

( * ) Notice: Subject to any disclaimer, the term of this patent is extended or adjusted under 35 U.S.C. 154(b) by 138 days.

(21) Appl. No.: 18/301,532

(22) Filed: Apr. 17, 2023

(65) Prior Publication Data

US 2023/0255005 A1 Aug. 10, 2023

Related U.S. Application Data

(63) Continuation-in-part of application No. 17/374,062, filed on Jul. 13, 2021, now abandoned.

(30) Foreign Application Priority Data

Nov. 19, 2020 (CN) .......................... 202022689563.X

(51) Int. Cl.
*H05K 7/20* (2006.01)
*H02M 7/00* (2006.01)
(Continued)

(52) U.S. Cl.
CPC ............ *H05K 7/209* (2013.01); *H02M 7/003* (2013.01); *H05K 1/181* (2013.01); *H05K 7/1427* (2013.01);
(Continued)

(58) Field of Classification Search
CPC .. H05K 7/209; H05K 7/2049; H05K 7/20454; H05K 7/20472; H05K 7/20936; H05K 1/181; H05K 7/1427; H02M 7/003
See application file for complete search history.

(56) References Cited

U.S. PATENT DOCUMENTS

| 6,586,825 | B1 | 7/2003 | Rajagopalan et al. |
| 7,342,788 | B2 | 3/2008 | Nikfar |

(Continued)

FOREIGN PATENT DOCUMENTS

| CN | 102340233 B | 5/2014 |
| CN | 110265367 A | 9/2019 |

(Continued)

OTHER PUBLICATIONS

Extended European Search Report regarding Patent Application No. EP211883517, dated Jan. 28, 2022.

(Continued)

*Primary Examiner* — Zachary Pape
(74) *Attorney, Agent, or Firm* — Harness, Dickey & Pierce, P.L.C.

(57) ABSTRACT

The present application relates to the technical field of semiconductor, and in particular to an inverter. The inverter provided by the present application includes a substrate, a discrete device and a heat conducting component. The discrete device and the heat conducting component are both arranged on the substrate. A part of the heat conducting component is located in an area of the substrate where the discrete device is provided, and another part of the heat conducting component is located in an area of the substrate where the discrete device is not provided. The heat conducting component may rapidly transfer the heat of the overheated area of the substrate where the discrete device is mounted to the less hot area of the substrate, and promote the (Continued)

heat generated by the discrete device to spread evenly to the substrate.

8 Claims, 2 Drawing Sheets

(51) Int. Cl.
  *H05K 1/18* (2006.01)
  *H05K 7/14* (2006.01)
(52) U.S. Cl.
  CPC ....... *H05K 7/2049* (2013.01); *H05K 7/20454* (2013.01); *H05K 7/20472* (2013.01); *H05K 7/20936* (2013.01)

(56) References Cited

U.S. PATENT DOCUMENTS

| | | | |
|---|---|---|---|
| 7,921,663 B2 | 4/2011 | Ueno et al. | |
| 9,020,656 B2 | 4/2015 | Shelnutt et al. | |
| 10,219,411 B1 | 2/2019 | Chang et al. | |
| 10,450,892 B2 | 10/2019 | Ranjan | |
| 10,605,538 B2 | 3/2020 | Ahamed et al. | |
| 10,638,646 B2 | 4/2020 | Guo et al. | |
| 11,324,143 B2 | 5/2022 | Stefanoski et al. | |
| 2007/0158831 A1 | 7/2007 | Cha et al. | |
| 2012/0227937 A1 | 9/2012 | Luo et al. | |
| 2013/0308275 A1 | 11/2013 | Yamanaka | |
| 2016/0209121 A1 | 7/2016 | Yeh et al. | |
| 2016/0316589 A1 | 10/2016 | Silvennoinen et al. | |
| 2018/0376613 A1 | 12/2018 | Chida et al. | |
| 2019/0069438 A1* | 2/2019 | Guo | H05K 1/0203 |
| 2020/0352054 A1 | 11/2020 | Schmit et al. | |
| 2022/0053634 A1 | 2/2022 | Zhou et al. | |

FOREIGN PATENT DOCUMENTS

| | | | | |
|---|---|---|---|---|
| CN | 110591128 A | | 12/2019 | |
| CN | 213754350 U | * | 7/2021 | ............. H02M 7/00 |
| EP | 2844052 A2 | | 3/2015 | |

OTHER PUBLICATIONS

First Examination Report regarding Patent Application No. IN202144035514, dated May 27, 2022.

* cited by examiner

INVERTER HAVING HEAT CONDUCTING COMPONENT

CROSS-REFERENCE TO RELATED APPLICATIONS

This application is a continuation-in-part of U.S. application Ser. No. 17/374,062, filed on Jul. 13, 2021; which claims benefit of Chinese Application No. 202022689563.X, filed on Nov. 19, 2020.

FIELD

The present application relates to the technical field of semiconductor, and in particular to an inverter.

BACKGROUND

In an inverter, because the heat generated by discrete devices is high, the heat in the area where the discrete device is mounted on the substrate is higher than the heat in the area where no discrete device is mounted. As a result, the heat on the substrate is uneven, and local overheating is easy to occur, which results in the damage of discrete devices in the local overheating area.

Based on this, it is urgent to invent an inverter to solve the problems of uneven heat distribution and easy local overheating of the substrate.

SUMMARY

An object of the present application is to provide an inverter in which the heat generated by the discrete device is evenly diffused to the substrate, by which it can be ensured that the heat on the substrate is uniform and the discrete device operates normally.

To achieve the above object, the following technical solution is provided in the present application.

An inverter includes a substrate, a discrete device, a PCB board, and electronic components,
  where the electronic components are configured to be inserted and soldered on the PCB board, and the discrete device is configured to be soldered on the PCB board from one side of the discrete device,
  where the other side of the discrete device is arranged on a side of the substrate to dissipate heat generated by the discrete device through the substrate,
  where the inverter further includes:
  a heat conducting component, the heat conducting component is arranged on the substrate, a part of the heat conducting component is located in an area of the substrate where the discrete device is provided, and another part of the heat conducting component is located in an area of the substrate where no discrete device is provided, a heat conducting component mounting groove is defined on the substrate, the heat conducting component is arranged in the heat conducting component mounting groove;
  a heat sink arranged on the other side of the substrate and integrated with the substrate, wherein the heat sink is configured to dissipate heat from the substrate; and
  a mounting assembly, wherein the mounting assembly is configured to fix the discrete device onto the substrate on which the heat conducting component is mounted, where the mounting assembly includes:
  a heat conducting gasket, wherein the discrete device is placed on the heat conducting gasket and the heat conducting gasket is in contact with the heat conducting component, wherein a gasket mounting groove is defined on the substrate, and the heat conducting gasket is placed in the gasket mounting groove and above the heat conducting component and is directly in contact with the discrete device;
  a pressing sheet which is placed on the discrete device; and
  a fixing member which is configured to fix the pressing sheet to the substrate,
  where the fixing member passes through the pressing sheet and the substrate in turn to fix the pressing sheet to the substrate.

Preferably, a side wall of the heat conducting component mounting groove is bonded with the heat conducting component by an adhesive.

Preferably, a thickness of the substrate at a position where the heat conducting component mounting groove is defined is greater than a thickness of the substrate at a position where the heat conducting component mounting groove is not defined.

Preferably, a side of the heat conducting gasket in contact with the gasket mounting groove is coated with a thermal conductive adhesive, and a side of the heat conducting gasket in contact with the discrete device is also coated with the thermal conductive adhesive.

Preferably, a protrusion is provided on a side of the pressing sheet close to the discrete device, and the protrusion is pressed against the discrete device.

Preferably, the heat sink is in type of fin.

Preferably, the inverter further includes:
  a temperature detection component, wherein the temperature detection component is configured to detect a temperature of the discrete device, and when the detected temperature is greater than a preset value, the temperature detection component controls the discrete device to reduce the working power.

The present application has the following beneficial effects.

In the inverter provided by the present application, the heat conducting component penetrates through the area where the discrete device is mounted and the area where no discrete device is mounted on the substrate, so that the heat generated by the discrete device is evenly diffused to the substrate, ensuring that the heat on the substrate is uniform, and achieving the effect of equalizing the heat of the substrate, thereby ensuring the normal operation of the discrete device.

Figure 1:
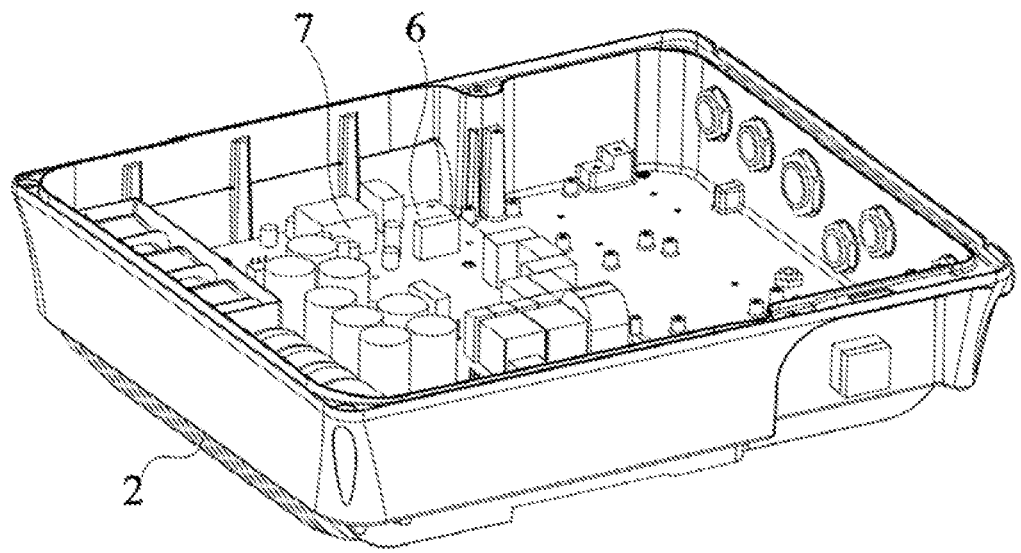
FIG. 1 is a schematic structural view of an inverter provided by an embodiment of the present application.

Reference numerals in the drawings are listed as follows:
1 substrate;
11 heat conducting component mounting groove;
12 gasket mounting groove;
13 fixing groove;
2 heat sink;
3 discrete device;

4 heat conducting component;
5 mounting assembly;
51 heat conducting gasket;
52 pressing sheet;
521 mounting hole;
522 protrusion;
53 fixing member;
6 PCB board;
7 electronic component;
8 temperature detection component.

DETAILED DESCRIPTION OF THE EMBODIMENTS

In order to make the technical problems solved by the present application, the technical solutions adopted by the present application and the technical effects achieved by the present application more clear, the technical solutions of the present application will be further explained below in conjunction with the drawings and specific embodiments.

In the description of the present application, unless otherwise explicitly specified and defined, terms such as "connection" and "joint", and "fixation" should be understood in a broad sense, for example, the terms may imply a fixed connection, a detachable connection, or an integral connection; a mechanical connection, or an electrical connection; a direct connection or an indirect connection through an intermediate media; an internal connection inside two components or the interaction relationship between the two components. For those skilled in the art, the specific meaning of the above terms in the present application may be understood in the light of specific circumstances.

In the present application, unless otherwise specified and defined, the expression that the first feature is located "above" or "below" the second feature may include that the first feature directly contacts with the second feature, and may also include that the first feature does not directly contact with the second feature but contacts with the second feature through another feature between the two. Furthermore, the expression that the first feature is located "above", "over" and "on" the second feature includes that the first feature is located directly above and obliquely above the second feature, or simply indicates that the height of the first feature from a horizontal surface is greater than that of the second feature. The expression that the first feature is located "below", "under" and "beneath" the second feature includes that the first feature is located directly below and obliquely below the second feature, or simply indicates that the height of the first feature from a horizontal surface is smaller than that of the second feature.

In the description of the present application, the orientation or positional relationships indicated by terms "up", "down", "left", "right" and the like are based on the orientation or positional relationships shown in the drawings, and are merely for the ease and simplification of the description, and do not indicate or imply that the device or element referred to must be in a particular orientation, or be constructed and operated in a particular orientation, and therefore should not be construed as a limit to the scope of the present application. In addition, the terms "first" and "second" are merely used to distinguish two elements in description, and have no special meaning.

Figure 2:
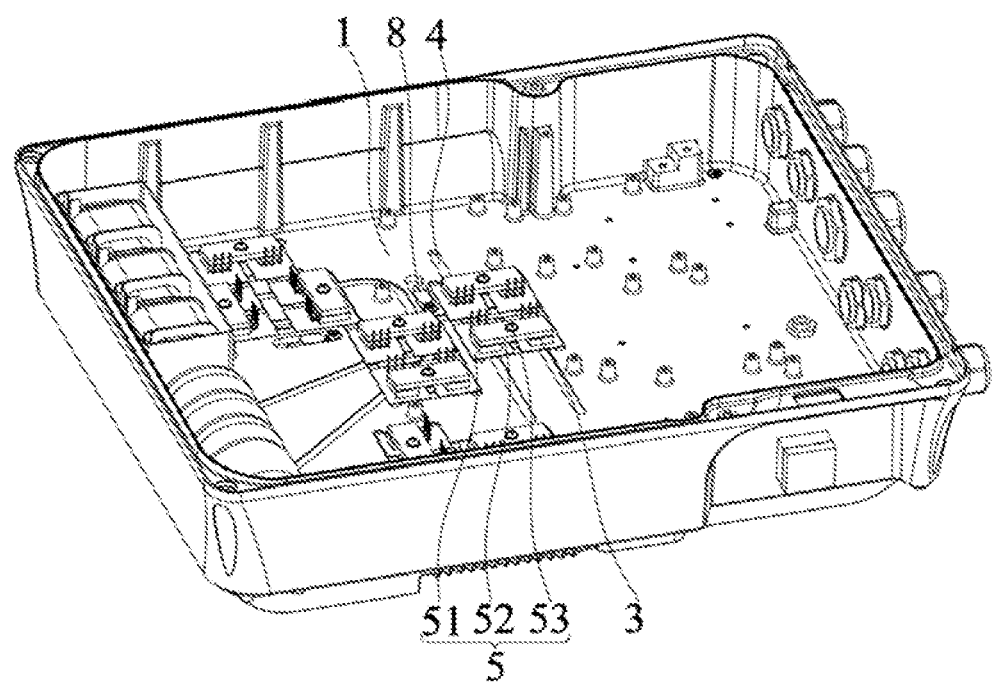
FIG. 2 is a schematic structural view of the inverter provided by an embodiment of the present application with the PCB board and electronic components removed.

As shown in FIGS. 1 to 2, the inverter includes a substrate 1, a heat sink 2, a discrete device 3, a PCB board 6, and an electronic components 7. The discrete device 3 and the electronic components 7 are soldered on the PCB board 6 to form the working circuit of the inverter. Particularly, the electronic components 7 are inserted and soldered on the PCB board 6, and the discrete device 3 is soldered on the PCB board 6 from one side of the discrete device 3. Further, the other side of the discrete device 3 is arranged on a side of the substrate 1 to dissipate heat generated by the discrete device 3 through the substrate 1, and the heat sink 2 is arranged on the other side of the substrate 1. The heat sink 2 is configured to dissipate heat for the substrate 1, so that the substrate 1 is readily to transmit the heat to the heat sink 2 on the other side of the substrate 1 without any power devices (i.e., discrete device 3) in order to avoid excessive heat of the inverter, thereby ensuring the normal operation of the inverter. Specifically, in this embodiment, the heat sink 2 is in a type of fin, the fin type heat sink has a good heat dissipation effect, is not easy to be corroded and damaged, and has a long service life. In other embodiments, the heat sink 2 may also be in other forms such as a water pipe heat sink and a fan heat sink.

Preferably, as shown in FIG. 1, the heat sink 2 is integrated with the substrate 1, which can ensure the close contact between the heat sink 2 and the substrate 1, thereby ensuring the heat dissipation effect of the heat sink 2 for the substrate 1. In other embodiments, the heat sink 2 is detachably connected with the substrate 1, and if a part of the heat sink 2 or the substrate 1 fails alone, there is no need to replace the entire structure, and only the fault part needs to be replaced. Preferably, the substrate 1 is configured to dissipate heat generated by the discrete device 3 arranged thereon. The substrate 1 may be made of metal material or other high thermal conductivity materials in order to further improve the heat-dissipation effort of the substrate 1.

In the inverter, since the heat generated by the discrete device 3 is high, the heat in the area where the discrete device 3 is mounted on the substrate 1 is higher than the heat in the area where no discrete device 3 is mounted. As a result, the heat on the substrate 1 is uneven, and local overheating is easy to occur, which results in the problem of local overheating and the damage of the discrete device 3.

In order to solve the problem of local overheating of the substrate 1, as shown in FIG. 1 to FIG. 2, the inverter further includes a heat conducting component 4. The heat conducting components 4 is entirely arranged on the substrate 1. A part of the heat conducting component 4 is located in an area of the substrate 1 where the discrete device 3 is provided, and another part of the heat conducting component 4 is located in an area of the substrate 1 where no discrete device 3 is provided. The heat conducting component 4 can uniformly diffuse the heat generated by the discrete device 3 to the substrate 1, thereby ensuring the uniformity of heat on the substrate 1, achieving the effect of equalizing the heat of the substrate 1, and further ensuring the normal operation of the discrete device 3. Specifically, in this embodiment, the heat conducting component 4 is a heat pipe. The heat pipe has good heat conducting performance, and can quickly transfer the heat of the heat source to the outside of the heat source. In other embodiments, the heat conducting component 4 may also be a heat conducting metal, a high thermal-conductive insulating material and the like.

Because the heat distribution on the substrate 1 is uneven, local overheating is easy to occur, so a heat sink 2 with a good effect is necessary to avoid local overheating of the substrate 1. The heat sink 2 with a good effect is generally large in size, which leads to an increase in the size of the inverter. After using the heat conducting component 4, the heat on the substrate 1 is uniform, and local overheating may not occur. Therefore, a smaller heat sink 2 may meet the heat dissipation requirement. Therefore, the size of the inverter may be correspondingly reduced, thereby increasing the power density of the inverter and enhancing the market competitiveness of the inverter.

In this embodiment, as shown in FIG. 2, the inverter further includes a mounting assembly 5. The mounting assembly 5 fixes the discrete device 3 on the substrate 1 on which the heat conducting component 4 is mounted, realizing the effective fixation of the discrete device 3 with the substrate 1 and ensuring that the heat generated by the discrete device 3 is quickly diffused to the entire substrate 1 through the heat conducting component 4. By arranging the heat sink 2 and the discrete device 3 on the opposite sides of the substrate 1, respectively, the heat generated by the discrete device 3 is transmitted to the heat conducting component 4, and then uniformly transmitted to the substrate 1, and then to the heat sink 2 by the substrate 1, so as to improve the heat-dissipation effort to the discrete device 3.

Figure 3:
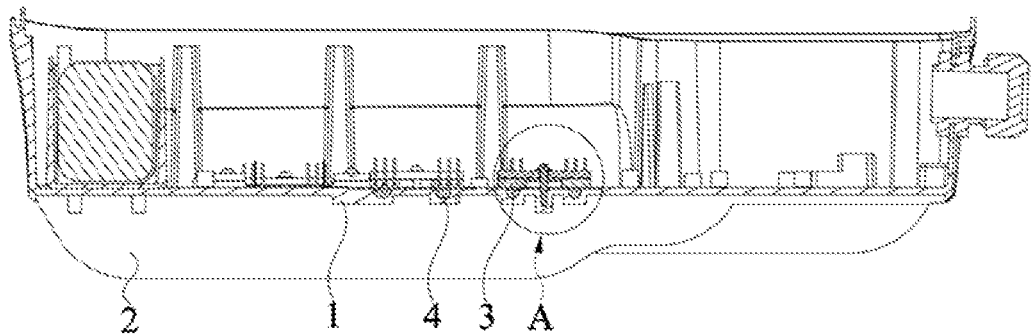
FIG. 3 is a cross-sectional view of the inverter provided by the embodiment of the present application with the PCB board and electronic components removed.
Figure 4:
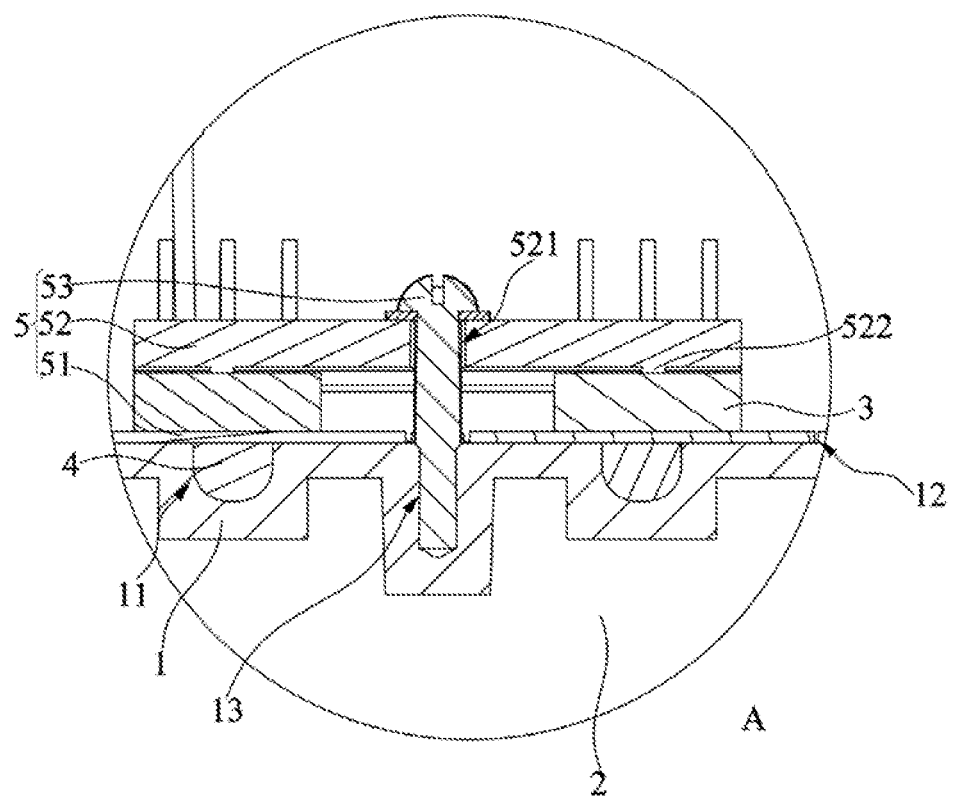
FIG. 4 is a partial enlarged view of portion A in FIG. 3.

The specific structure of the discrete device 3 is described in conjunction with FIG. 2 to FIG. 4. As shown in FIG. 2 to FIG. 4, the mounting assembly 5 includes a heat conducting gasket 51, a pressing sheet 52 and a fixing member 53. The discrete device 3 is placed on the heat conducting gasket 51, and the heat conducting gasket 51 is in contact with the heat conducting component 4. The pressing sheet 52 is placed on one or more discrete device 3, the fixing member 53 passes through the pressing sheet 52 and the substrate 1 in turn to fix the pressing sheet 52 to the substrate 1, which may promote the close contact between the discrete device 3 and the heat conducting gasket 51, and then transfer the heat of the discrete device 3 to the heat conducting component 4. The heat conducting gasket 51 has a flat plate structure, which may increase the contact area between the discrete device 3 and the heat conducting gasket 51 and promote the rapid transfer of heat generated by the discrete device 3 to the heat conducting component 4 through the heat conducting gasket 51. Specifically, in this embodiment, the heat conducting gasket 51 is a ceramic gasket. The ceramic gasket has good thermal conductivity, and has the advantages of flexible texture and tear resistance. In other embodiments, the heat conducting gasket 51 may also be an insulating heat conducting gasket of other materials, and may be a silicone grease heat conducting gasket or a mica heat conducting gasket. As long as the gasket can transfer the heat generated by the discrete device 3 to the heat conducting component 4, it can be used in this application.

Preferably, as shown in FIG. 3 to FIG. 4, a thickness of the substrate 1 at a position where the fixing member 53 is mounted is greater than a thickness at a position where the fixing member 53 is not mounted. With such arrangement, the mounting thickness of the fixing member 53 and the substrate 1 may be increased, and the mounting stability of the fixing member 53 may be enhanced, so that the pressing sheet 52, the discrete device 3 and the heat conducting gasket 51 are more firmly fixed with the substrate 1.

Preferably, as shown in FIG. 4, a protrusion 522 is provided on a side of the pressing sheet 52 close to the discrete device 3. The protrusion 522 presses against the discrete device 3, which may increase the pressure of the pressing sheet 52 on the discrete device 3, and ensure that the pressing sheet 52, the discrete device 3, and the heat conducting gasket 51 are in closer contact with the heat conducting component 4.

Preferably, multiple adjacent discrete devices 3 may be placed on one heat conducting gasket 51, which may reduce the number of heat conducting gaskets 51 and achieve the maximum utilization of resources.

Preferably, the pressing sheet 52 may be made of a cured epoxy resin material, which has good flexibility and can avoid damage to the discrete device 3.

In addition, as shown in FIG. 3 to FIG. 4, a heat conducting component mounting groove 11 is defined on the substrate 1. The heat conducting component mounting groove 11 is coated with an adhesive therein to fix the heat conducting component 4 in the heat conducting component mounting groove 11, which may not only ensure the fixation of the heat conducting component 4 with the substrate 1, but also fill the gap between the heat conducting component 4 and the substrate 1. Therefore, it can be ensured that the heat conducting component 4 is in close contact with the substrate 1, and the heat sink 2 may dissipate heat from the substrate 1 more effectively. Specifically, the adhesive provided in this embodiment is epoxy resin. The epoxy resin has good adhesion and excellent thermal conductivity, which may promote the heat conducting component 4 to uniformly transfer heat to the substrate 1. In other embodiments, the adhesive may also be an adhesive made of other materials such as hot melt adhesive, unsaturated polyester resin, and organic silicone adhesive.

Generally, the thickness of the substrate 1 is relatively thin. In order to avoid the problem of poor bearing capacity and insecureness of the substrate 1 after the heat conducting component mounting groove 11 is provided, as shown in FIG. 3 to FIG. 4, the thickness of the substrate 1 at a position where the heat conducting component mounting groove 11 is provided is greater than the thickness of the substrate 1 at a position where the heat conducting component mounting groove 11 is not provided, ensuring the firmness and bearing capacity of the substrate 1.

In order to increase the contact area between the heat conducting gasket 51 and the heat conducting component 4, as shown in FIG. 4, a gasket mounting groove 12 is provided on the substrate 1, and the heat conducting gasket 51 is placed in the gasket mounting groove 12. A bottom surface of the heat conducting component mounting groove 11 is flush with a top surface of the heat conducting component 4, which ensures that the heat conducting gasket 51 is placed neatly in the gasket mounting groove 12 and above the heat conducting component 4, so as to ensure that the heat conducting gasket 51 and the heat conducting component 4 are in close contact. Specifically, firstly, a heat conducting component mounting groove 11 is formed on the substrate 1, and then the gasket mounting groove 12 is milled flat after the heat conducting component 4 is placed into the heat conducting component mounting groove 11. Therefore, it is ensured that the plane of the heat conducting component mounting groove 11 is flush with the plane of the gasket mounting groove 12.

Preferably, a side of the heat conducting gasket 51 in contact with the gasket mounting groove 12 is coated with a thermal conductive adhesive, and a side of the heat conducting gasket 51 in contact with the discrete device 3 is also coated with the thermal conductive adhesive. The thermal conductive adhesive can enhance the thermal conductivity of the heat conducting gasket 51. Specifically, the thermal conductive adhesive may be silicone grease, the silicone grease has good thermal conductivity, stable performance in a high-temperature environment, and is not easy to be corroded.

Preferably, as shown in FIG. 2, the inverter further includes a temperature detection component 8. The temperature detection component 8 is configured to detect the temperature of the discrete device 3. When the detected temperature of the discrete device 3 is greater than a preset value, the temperature detection component 8 controls the discrete device 3 to reduce the working power, so as to avoid damage caused by overheating of the discrete device 3 and avoid the whole inverter from being burnt down, thus ensuring the safe operation of the inverter. Specifically, the temperature detection component 8 is a thermistor detection circuit, and the thermistor has the advantages of being sensitive to temperature, high sensitivity, small size, and good stability.

Preferably, the temperature detection component 8 is placed around the discrete device 3 where the heat conducting components 4 are distributed in a concentrated manner, which may ensure that the temperature detection component 8 may detect the temperature of the heat concentrated area inside the inverter and realize the temperature monitoring of the high heat area by the temperature detection component 8. Preferably, a distance between the temperature detection component 8 and the discrete device 3 ranges from 5 mm to 10 mm, which can ensure more accurate temperature detection while avoiding damage to the temperature detection component 8.

In order to facilitate the understanding of the specific structure of the inverter with the heat conducting component 4, the specific mounting method of the inverter is described as follows:

S1: the electronic component 7 is inserted on one side of the PCB board 6, and the electronic component 7 is soldered on the PCB board 6 from other side of the PCB board 6;

S2: the pressing sheet 52 is mounted on other side of the PCB board 6, the discrete device 3 covered with the pressing sheet 52 is inserted from other side of the PCB board 6, and the discrete device 3 is soldered on the PCB board 6 from one side of the PCB board 6;

S3: the heat conducting component mounting groove 11 is milled on the substrate 1 where the heat sink 2 is mounted, an adhesive is applied in the heat conducting component mounting groove 11, and the heat conducting component 4 is bonded in the heat conducting component mounting groove 11;

S4: after the adhesive is cured, the gasket mounting groove 12 is milled on the substrate 1, and the heat conducting gasket 51 coated with a thermal conductive adhesive on two sides is placed in the gasket mounting groove 12;

S5: the PCB 6 welded with the discrete device 3 is mounted into the inverter box; and S6: the fixing member 53 is inserted from one side of the PCB board 6 to fix the pressing sheet 52, the discrete device 3 and the heat conducting gasket 51 on the substrate 1.

Preferably, in other embodiments, both the electronic component 7 and the discrete device 3 may be placed on one side of the PCB board 6 to realize one-step soldering to the PCB board 6 and save soldering steps.

In other embodiments, the discrete device 3 may also be located in the margin area of the PCB board 6. As long as the arrangement allows the discrete device 3 to be connected to the PCB board 6, it can be used in this application.

Apparently, the above embodiments of the present application are merely examples to clearly illustrate the present application, and are not intended to limit the implementation of the present application. For those of ordinary skill in the art, other changes or modifications in different forms can be made on the basis of the above description. It is unnecessary and impossible to list all the implementations here. Any modifications, equivalent substitutions or improvements made within the spirit and principle of the present application shall fall within the protection scope of the appending claims of the present application.

The invention claimed is:

1. An inverter, comprising a substrate, a discrete device, a PCB board, and electronic components,
   wherein the electronic components are configured to be inserted and soldered on the PCB board, and the discrete device is configured to be soldered on the PCB board from one side of the discrete device,
   wherein the other side of the discrete device is arranged on a side of the substrate to dissipate heat generated by the discrete device through the substrate,
   wherein the inverter further comprises:
   a heat conducting component, the heat conducting component is arranged on the substrate, a part of the heat conducting component is located in an area of the substrate where the discrete device is provided, and another part of the heat conducting component is located in an area of the substrate where no discrete device is provided, a heat conducting component mounting groove is defined on the substrate, the heat conducting component is arranged in the heat conducting component mounting groove;
   a heat sink arranged on the other side of the substrate and integrated with the substrate, wherein the heat sink is configured to dissipate heat from the substrate; and
   a mounting assembly, wherein the mounting assembly is configured to fix the discrete device onto the substrate on which the heat conducting component is mounted,
   wherein the mounting assembly comprises
   a heat conducting gasket, wherein the discrete device is placed on the heat conducting gasket and the heat conducting gasket is in contact with the heat conducting component, wherein a gasket mounting groove is defined on the substrate, and the heat conducting gasket is placed in the gasket mounting groove and above the heat conducting component and is directly in contact with the discrete device;
   a pressing sheet which is placed on the discrete device; and
   a fixing member which is configured to fix the pressing sheet to the substrate,
   wherein the fixing member passes through the pressing sheet and the substrate in turn to fix the pressing sheet to the substrate.

2. The inverter according to claim 1, wherein a side wall of the heat conducting component mounting groove is bonded with the heat conducting component by an adhesive.

3. The inverter according to claim 2, wherein a thickness of the substrate at a position where the heat conducting component mounting groove is defined is greater than a thickness of the substrate at a position where the heat conducting component mounting groove is not defined.

4. The inverter according to claim 1, wherein a bottom surface of the heat conducting component mounting groove is flush with a top surface of the heat conducting component.

5. The inverter according to claim 4, wherein a side of the heat conducting gasket in contact with the gasket mounting groove is coated with a thermal conductive adhesive, and a side of the heat conducting gasket in contact with the discrete device is also coated with the thermal conductive adhesive.

6. The inverter according to claim 1, wherein a protrusion is provided on a side of the pressing sheet close to the discrete device, and the protrusion is pressed against the discrete device.

7. The inverter according to claim 1, wherein the heat sink is in type of fin.

8. The inverter according to claim 1, further comprising a temperature detection component, wherein the temperature detection component is configured to detect a temperature of the discrete device, and when the detected temperature is greater than a preset value, the temperature detection component controls the discrete device to reduce working power.

\* \* \* \* \*